US00RE39426E

(19) United States
(12) Reissued Patent
Johnson

(10) Patent Number: US RE39,426 E
(45) Date of Reissued Patent: Dec. 12, 2006

(54) THERMALLY ENHANCED FLIP CHIP PACKAGE AND METHOD OF FORMING

(75) Inventor: Eric Arthur Johnson, Greene, NY (US)

(73) Assignee: International Business Machines Corporation, Armonk, NY (US)

(21) Appl. No.: 09/379,985

(22) Filed: Aug. 24, 1999

Related U.S. Patent Documents

Reissue of:
(64) Patent No.: 5,726,079
Issued: Mar. 10, 1998
Appl. No.: 08/715,212
Filed: Sep. 17, 1996

U.S. Applications:
(62) Division of application No. 08/666,155, filed on Jun. 19, 1996, now abandoned.

(51) Int. Cl.
*H01L 21/44* (2006.01)

(52) U.S. Cl. ..... 438/106; 438/108; 438/127
(58) Field of Classification Search ..... 438/106, 438/107, 108, 111, 112, 118, 121–127
See application file for complete search history.

(56) References Cited

U.S. PATENT DOCUMENTS 5,289,346 A * 2/1994 Carey et al. ..... 438/127
5,359,768 A * 11/1994 Haley ..... 438/118
5,404,273 A 4/1995 Akagawa
5,405,809 A * 4/1995 Nakamura et al. ..... 438/64
5,410,451 A * 4/1995 Hawthorne et al. ..... 438/125
5,471,027 A * 11/1995 Call et al. ..... 438/126
5,490,324 A * 2/1996 Newman ..... 438/126
5,510,956 A 4/1996 Suzuki
5,619,070 A 4/1997 Kozono
5,625,226 A 4/1997 Kinzer
5,672,548 A 9/1997 Culnane et al.
5,989,940 A * 11/1999 Nakajima ..... 438/127

FOREIGN PATENT DOCUMENTS

JP 7-202064 8/1995
JP 7-321248 12/1995

* cited by examiner

*Primary Examiner*—Kevin M. Picardat
(74) *Attorney, Agent, or Firm*—RatnerPrestia

(57) ABSTRACT

A thermally conductive planar member is in thermally conductive communication with a flip chip encapsulated within a dielectric material that surrounds portions of the thermally conductive planar member, the flip-chip, and a predefined portion of a substrate member. The present invention provides a flip chip package having pick-and-place capability without the thermal resistance disadvantage of capped chip packages.

4 Claims, 2 Drawing Sheets

THERMALLY ENHANCED FLIP CHIP PACKAGE AND METHOD OF FORMING

Matter enclosed in heavy brackets [ ] appears in the original patent but forms no part of this reissue specification; matter printed in italics indicates the additions made by reissue.

This application is a division of application [of] Ser. No. 08/666,155 filed Jun. 19, 1996, now abandoned.

BACKGROUND OF THE INVENTION

1. Technical Field

This invention relates generally to encapsulated flip chips and more particularly to a flip chip package having a thermally conductive member encapsulated with the flip chip.

2. Background Art

Flip chips are small semiconductor dies having terminations all on one side in the form of solder pads or bump contacts. Typically, the surface of the chip has been passivated or otherwise treated. The flip chip derives its name from the practice of flipping, or turning, the chip over after manufacture, prior to attaching the chip to a matching substrate.

Flip chip packages require a cover of some type over the [silicone] *silicon* chip to protect it and to provide a large flat surface for pick-and-place operations. However, any cover or encapsulant above the chip increases the thermal resistance path to an ambient environment and, hence, the operational temperature of the chip.

Thermally conductive caps have also been provided for flip chips. Typically, a capped chip has a thin layer of a thermally conductive grease between the chip and the cap.

However, it has been found that during thermal cycling, the grease has a tendency to be pumped, or displaced from the interface between the chip and the cap, thus increasing the thermal resistance of the interface.

The present invention is directed to overcoming the problems set forth above. It is desirable to have a flip chip package that provides low thermal resistance, and is economical to manufacture. It is also desirable to have such a flip chip package and method of manufacture that uses conventional transfer mold techniques. It is also desirable to have such a flip chip package that does not require the presence of a thermally conductive grease between the chip and a heat conducting member.

SUMMARY OF THE INVENTION

In accordance with one aspect of the present invention, a flip chip package includes a substrate having a plurality of electrical circuits disposed within the substrate, a flip chip mounted on the substrate in electrical communication with predefined ones of the electrical circuits disposed in the substrate, and a thermally conductive planar member disposed in thermally conductive contact with an upper surface of the flip chip. The flip chip package also includes the substantially rigid dielectric material that surrounds the edge surfaces of the thermally conductive planar member, the edge surfaces of the flip chip, and at least a portion of the substrate.

Other features of the flip chip package embodying the present invention [includes] *include* the thermally conductive planar member having a thickness selected to provide a composite structure with the flip chip that extends a predetermined distance above the substrate.

In accordance with another aspect of the present invention, a method of forming a thermally enhanced flip chip package includes providing a substrate and a flip chip which are connected together such that the electrical contacts on the flip chip are in electrical communication with predetermined ones of the electrical contacts on the substrate. The method also includes providing a thermally conductive planar member which is placed on the upper surface of the flip chip in thermally conductive communication with the upper surface. The assembled planar member, flip chip and substrate are placed in a mold cavity wherein a predefined portion of the substrate cooperates to form a substantially closed cavity. The moldable dielectric material is injected into the closed mold cavity and, after curing, forms a substantially rigid covering about the edges of the thermally conductive planar member, the flip chip, and the predefined portion of the substrate.

Other features of the method of forming a thermally enhanced flip chip package include selecting a thermally conductive planar member having a thickness that is selected so that when the thermally conductive planar member is placed on the flip chip, the combined thickness of the planar member and the distance that the flip chip extends above the surface of the substrate, are substantially equal to the height of the aforementioned mold cavity.

DETAILED DESCRIPTION OF A PRESENTLY PREFERRED EXEMPLARY EMBODIMENT

Figure 1:
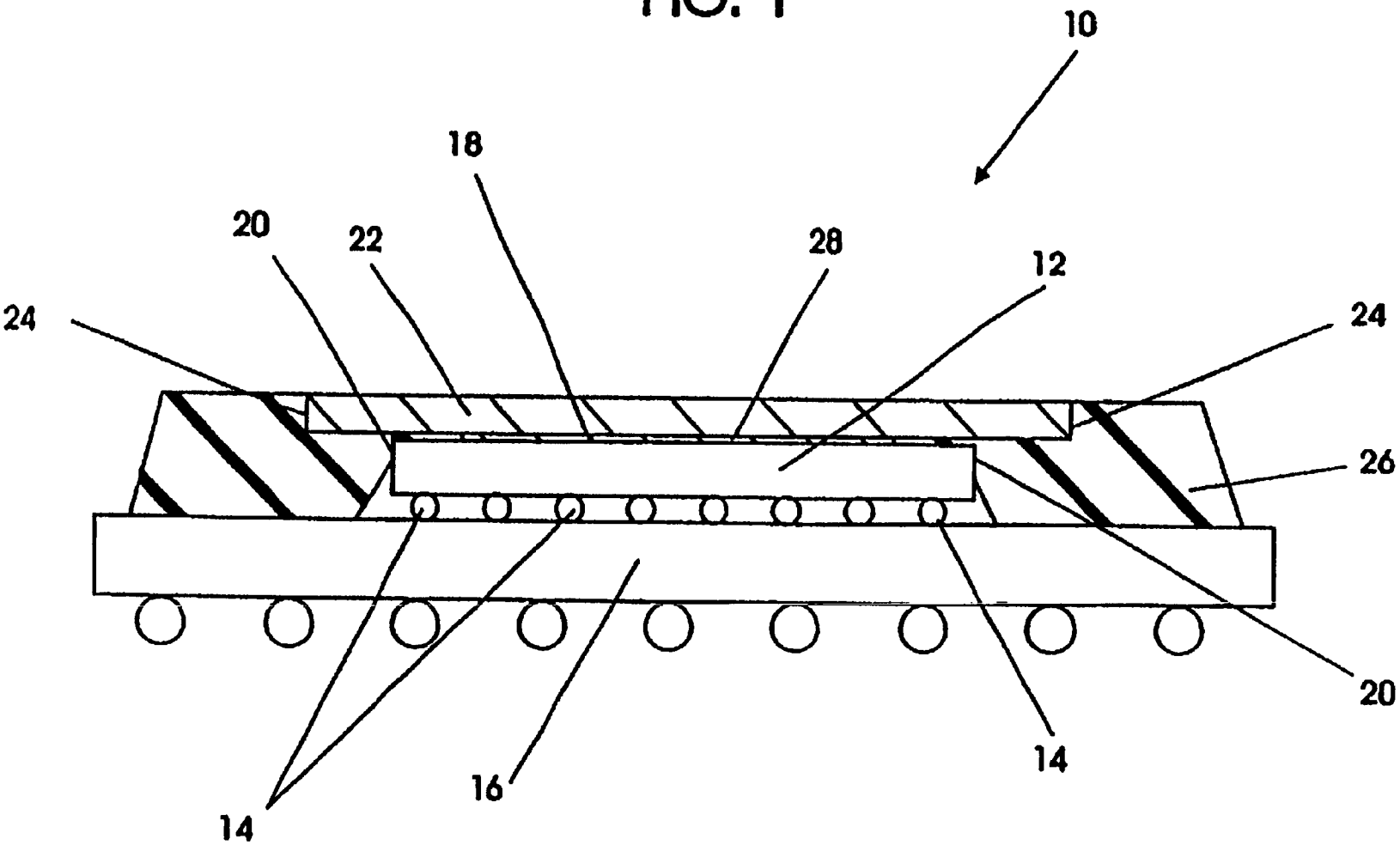
FIG. 1 is a schematic sectional view of a flip chip package embodying the present invention, showing the flip chip and substrate components of the package in elevation.

A flip chip package 10 embodying the present invention, is shown schematically in FIG. 1. The flip chip package 10 includes a flip chip 12 that has a plurality of electrical contacts 14 that are electronically connected, for example by soldered joints, to corresponding contacts associated with one or more electrical circuits disposed in a substrate member. The substrate member 16 is typically a laminated circuit board having a number of electrical circuits defined within the member and is adapted for interconnection with other components of an electronic assembly. The flip chip 12 has a planar upper surface [12] *18* that is spaced from the substrate 16 by a predefined distance, and a plurality of edge surfaces 20 that extend around a defined perimeter of the planar surface 18 and are disposed in substantially perpendicular relationship with the planar surface 18.

Importantly, the thermally enhanced flip chip package 10 embodying the present invention includes a thermally conductive planar member 22 that is disposed in thermally conductive communication with the planar upper surface 18 of the flip chip 12. The thermally conductive planar member 22 has a plurality of edge surfaces 24 that extend around the periphery of the planar member 22.

The thermally enhanced flip chip package embodying the present invention also includes a substantially rigid dielectric material 26, such as Toshiba XK6000 thermoset plastic, that surrounds, in intimate bonded contact, the edge surfaces 24 of the thermally conductive planar member 22, the edge surfaces 20 of the flip chip 12, and at least a portion of the laminated substrate 16. The dielectric material 26 effectively encapsulates the flip chip 12, and a portion of the planar member 22 and the substrate 16, without covering the upper exposed surface of the thermally conductive planar member 22.

In one embodiment of the present invention, it is desirable to form the flip chip package 10 by transfer mold techniques. To reduce the number of molds that may be required to accommodate variously sized chips, the thermally conductive planar members 22 may be formed by stamping from sheets, in a variety of thicknesses, and at very low cost. By using the appropriate thickness of planar member 22, various thicknesses of chips may be accommodated within a single mold. For that purpose, it is desirable that the thermally conductive planar member 22 have a thickness that is selected to provide a composite structure, when mounted on top of the flip chip 12, that extends a fixed predetermined distance above the substrate member 16. Thus, by simply varying the thickness of the planar member 22, the same mold cavity may be used for variously sized chips.

In the preferred embodiment, the thermally [conducted] *conductive* planar member 22 is placed in the mold cavity prior to inserting the flip chip 12 attached to the substrate member 16 into the mold cavity, after which the dielectric material 26 is injected into the cavity. Alternatively, the thermally conductive planar member 22 may be prebonded to the planar upper surface 18 of the flip chip 12 by a thermally conductive adhesive material 28 prior to placing the bonded assembly into the mold cavity and injecting the dielectric material 26 into the cavity.

Preferably, the thermally conductive planar material is formed of copper, which has a thermal coefficient of expansion substantially equal to that of laminated glass-epoxy printed wiring boards.

Figure 2:
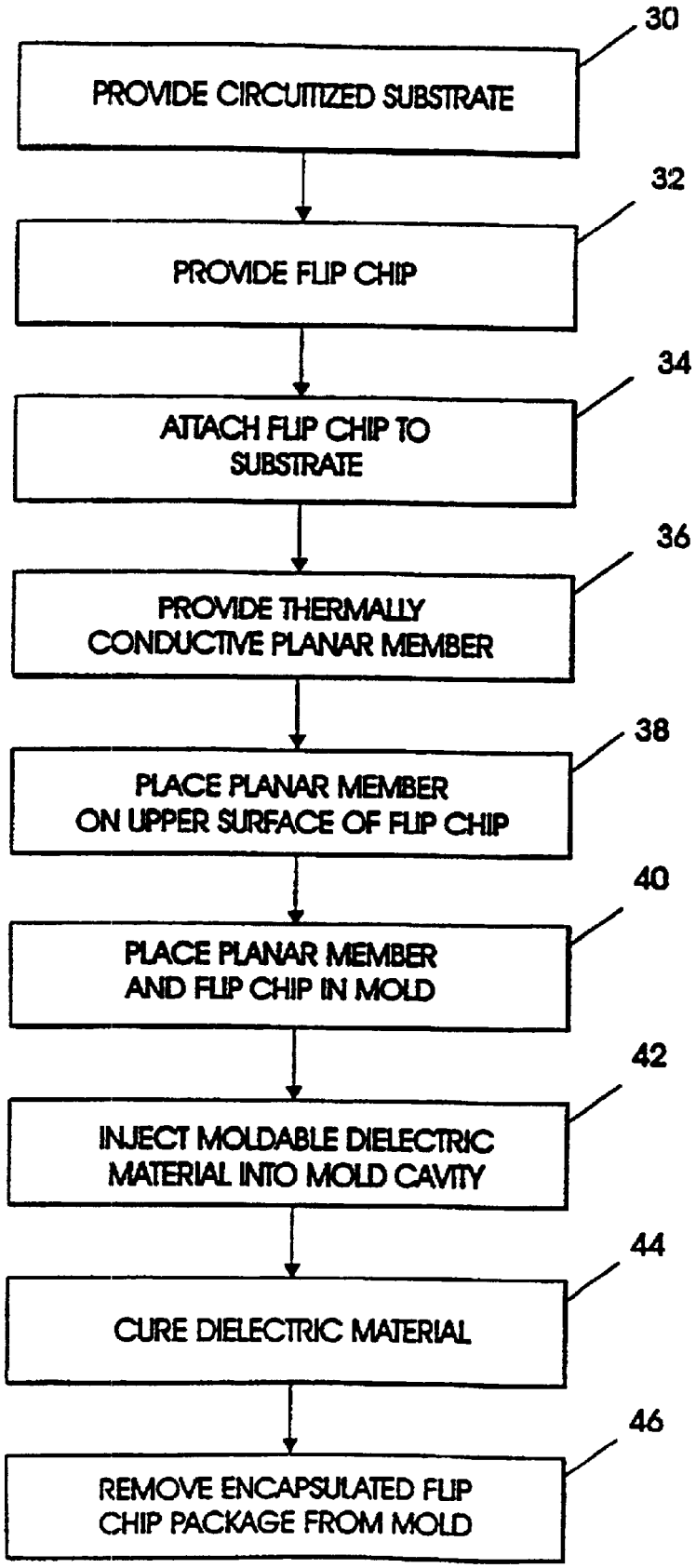
FIG. 2 is a flow diagram of the principal steps carried out in forming a flip chip package, in accordance with the method embodying the present invention.

The method of forming an enhanced flip chip package 10 embodying the present invention includes providing a substrate member 16 having a plurality of electrical contacts disposed on an upper surface of the substrate member, as indicated at block 30 in FIG. 2, and also providing a flip chip 12 having a plurality of electrical contacts 14 disposed on a lower surface, as indicated at block 32. The flip chip 12 is attached to the substrate member 16, as indicated at block 34, typically by a heating cycle in which solder interconnections are formed. If desired, an underfill material such as Dexter's HYSOL™ 4511 epoxy may be used to provide electrical isolation between the connected contacts.

A thermally conductive planar member 22, preferably a copper plate, is provided as indicated at block 36, and then placed on the upper surface 18 of the flip chip 12 so that the planar member 22 is in thermal communication with the upper surface of the flip chip 12, as indicated at block 38, either by intimate contact or by an adhesive bond to the upper surface 18.

The aligned thermally conductive planar member 22, the flip chip 12, and the substrate member 16 are then placed in a mold cavity, as indicated at block 40. A portion of the substrate member 16, i.e., the immediate area surrounding the mounted flip chip 12, cooperates with other predefined surfaces of the mold cavity to form a substantially closed cavity. A moldable dielectric material, such as a highly-filled epoxy, is then injected into the transfer mold, as indicated at block 42, and surrounds the edge surfaces 24 of the planar member 22 and the flip chip 12. As can be seen in FIG. 1, the dielectric material 26 also is forced into intimate contact against a portion of a lower surface of the thermally conductive member 22 and the surrounding area of the surface of the substrate member 16, thus essentially providing effective encapsulation of the flip chip 12 and the thermally conductive planar member 22 with the substrate member 16.

After curing the moldable dielectric material [28] *26*, as indicated at block 44, a substantially rigid dielectric covering is thereby formed over the thermally conductive planar member 22, the flip chip 12, and the predefined portion of the substrate member 16, providing an integral, essentially inseparable, package 10. After curing, the formed package 10 is removed from the mold, as indicated at block 46.

Preferably, in carrying out the method of forming a thermally integrated flip chip package 10, a single mold cavity may be advantageously used for a variety of differently sized flip chips 12 by varying the thickness of the planar member 22. If accurately sized, there will be no dielectric material over the top exposed surface of the planar member 22. This is desirable so that the heat conductive path from the flip chip 12 has a minimum number of interfacial resistances in the path of heat flow. Thus, it is desirable to control the thickness of the planar member 22 so that its upper surface is flush with the surface of the mold compound on the finished part. In this arrangement, no adhesive material would be required between the thermally conductive planar member 22 and the flip chip 12, although a thermally conductive adhesive material [as] may be used, if desired, as an assembly aid.

In summary, the flip chip package arrangement and method of forming provides a flip chip package 10 that is reliable in performance and easy to manufacture. These objectives are accomplished by using the transfer mold technique to encapsulate the chip, along with a thermally conductive planar member 22 that is used as an insert during molding. Alternatively, the insert 22 [maybe] *may be* attached to the top of the flip chip 12 by use of a small amount of a thermally conductive adhesive material.

The planar member 22 may be stamped from sheets, of varying thicknesses, at very low cost. By using the appropriate thickness of insert, any thickness chip can be accommodated within a single mold. The thickness of the planar member 22 should be selected to match the height of the cavity in the mold, when combined with the flip chip 12, to avoid excessive loads on the chip-to-substrate interconnection when the mold is clamped.

The thermal performance of a flip chip package 10 embodying the present invention, preferably without an adhesive layer, will be substantially identical to that of a capped chip, using thermal grease. Furthermore, the flip chip package 10 embodying the present invention has the advantage of avoiding any possibility of pumping which may deplete the grease layer and increase the thermal resistance, as may occur with capped chips. Importantly, the performance of the flip chip package 10 embodying the present invention, is significantly better than that of any package which uses overmold without the thermally conductive planar member 22. In addition, bending of the package 10 is reduced as a result of balancing the expansion of the substrate member 16 and the planar member 22, providing high reliability and improved coplanarity when embodied in a Ball Grid Array (BGA) package.

Although the present invention is described in terms of a preferred exemplary embodiment, those skilled in the art will recognize that changes in the order in which various components, e.g., the substrate member 16, the thermally conductive planar member 22, and the flip chip 12, are provided may be [varied] *made* without departing from the spirit of *the* invention. Such changes are intended to fall within the scope of the following claims. Other aspects, features, and advantages of the present invention may be obtained from a study of this disclosure and the drawings, along with the appended claims.

What is claimed is:

1. A method of forming a flip chip package, comprising:

providing a substrate member having a plurality of electrical contacts disposed thereon;

providing a flip chip having a plurality of electrical contacts disposed on a lower surface, a planar upper surface, and a plurality of edge surfaces extending between said lower and said upper surfaces;

connecting the electrical contacts of said flip chip with selected ones of the electrical contacts on *a top surface of* said substrate;

providing a thermally conductive planar member having a plurality of peripherally disposed edge surfaces;

[placing said thermally conductive planar member in thermally conductive communication with said upper surface of the flip chip;]

placing said thermally conductive planar member, said flip chip, and said substrate member in a mold cavity wherein a predefined portion of said substrate member cooperates with said mold cavity to define a sealable cavity;

injecting a moldable dielectric material into said sealable cavity;

curing said moldable dielectric material and thereby forming a sealed rigid dielectric covering about the edge surfaces of said thermally conductive planar member, *so that said moldable dielectric material is prevented from extending below said substrate member,* the edge surfaces of said flip chip, and said predefined portion of said substrate member and forming an encapsulated flip chip package comprising said thermally conductive planar member, said flip chip, and said [predefined portion of said] substrate member, and removing said flip chip package from said [sealed covering] *mold cavity*.

2. A method of forming a flip chip package, as set forth in claim [1] *4*, wherein said mold cavity has a first selected height and said thermally conductive planar member has a thickness selected so that when mounted on the upper planar surface of the flip chip, said planar member extends a second selected height being substantially equal to the first selected height of said mold cavity.

3. A method of forming a flip chip package, as set forth in claim [1] *4*, wherein placing said thermally conductive planar member [on] *in thermally conductive communication with* said upper surface of the flip chip includes bonding said planar member to the upper surface of the flip chip with a thermally conductive adhesive material.

*4. A method of forming a flip chip package, as set forth in claim 1, further comprising the step, after providing a thermally conductive planar member, of placing said thermally conductive planar member in thermally conductive communication with said upper surface of the flip chip.*

* * * * *